United States Patent
Usami

(10) Patent No.: US 10,490,517 B2
(45) Date of Patent: Nov. 26, 2019

(54) SEMICONDUCTOR DEVICE AND MANUFACTURING METHOD THEREOF

(71) Applicant: Renesas Electronics Corporation, Koutou-ku, Tokyo (JP)

(72) Inventor: Tatsuya Usami, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/987,169

(22) Filed: May 23, 2018

(65) Prior Publication Data

US 2018/0350760 A1    Dec. 6, 2018

(30) Foreign Application Priority Data

Jun. 5, 2017   (JP) .................... 2017-110582

(51) Int. Cl.
| | |
|---|---|
| *H01L 23/18* | (2006.01) |
| *H01L 23/00* | (2006.01) |
| *H01L 23/522* | (2006.01) |
| *H01L 23/532* | (2006.01) |

(52) U.S. Cl.
CPC .......... *H01L 24/03* (2013.01); *H01L 23/5226* (2013.01); *H01L 23/53238* (2013.01); *H01L 23/53295* (2013.01); *H01L 24/05* (2013.01); *H01L 2224/024* (2013.01); *H01L 2224/0239* (2013.01); *H01L 2224/02331* (2013.01); *H01L 2224/0401* (2013.01); *H01L 2224/05124* (2013.01)

(58) Field of Classification Search
CPC .......... H01L 24/05; H01L 24/12; H01L 24/32
See application file for complete search history.

(56) References Cited

U.S. PATENT DOCUMENTS

| | | | |
|---|---|---|---|
| 2008/0272500 A1* | 11/2008 | Ishio | ................... H01L 23/3114 257/782 |
| 2009/0206490 A1 | 8/2009 | Koide et al. | |
| 2011/0001236 A1 | 1/2011 | Koide et al. | |
| 2013/0001772 A1 | 1/2013 | Koide et al. | |

FOREIGN PATENT DOCUMENTS

JP       2009-194144 A     8/2009

* cited by examiner

*Primary Examiner* — Thomas L Dickey
(74) *Attorney, Agent, or Firm* — Shapiro, Gabor and Rosenberger, PLLC

(57) ABSTRACT

A semiconductor device and a manufacturing method thereof according to the present invention include: a first pad electrode formed in an uppermost wiring layer of a multi-layer wiring layer; a first insulating film formed on the first pad electrode; and a first organic insulating film formed over the first insulating film. Also, the semiconductor device and the manufacturing method thereof include: a barrier metal film formed on the first organic insulating film and connected to the first pad electrode; and a conductive film formed on the barrier metal film. Then, a second insulating film made of an inorganic material is formed on an upper surface of the first organic insulating film between the barrier metal film and the first organic insulating film.

18 Claims, 19 Drawing Sheets

SEMICONDUCTOR DEVICE AND MANUFACTURING METHOD THEREOF

CROSS-REFERENCE TO RELATED APPLICATION

The present application claims priority from. Japanese Patent Application No. 2017-110582 filed on Jun. 5, 2017, the content of which is hereby incorporated by reference into this application.

TECHNICAL FIELD OF THE INVENTION

The present invention relates to a semiconductor device and a manufacturing method thereof, and can be applied to, for example, a semiconductor device having a redistribution layer and a manufacturing method thereof.

BACKGROUND OF THE INVENTION

In recent years, from the demands for faster operation and miniaturization of semiconductor devices, a wiring referred to as a redistribution layer formed on a first pad electrode which is a part of an uppermost layer wiring of a multilayer wiring layer on a semiconductor substrate has been used. The redistribution layer is mainly composed of a thick copper film formed by, for example, the plating method in order to reduce the wiring resistance. Apart of an upper surface of the redistribution layer is a region to be connected to an external connection terminal formed of a bump electrode, a bonding wire, or the like, and constitutes a second pad electrode. Then, the second pad electrode is electrically connected to a printed circuit board or the like.

For example, Patent Document 1 (Japanese Patent Application Laid-Open Publication No. 2009-194144) describes a technique for forming a redistribution layer on a multilayer wiring layer.

SUMMARY OF THE INVENTION

In a semiconductor device using a redistribution layer, an organic insulating film such as polyimide is formed to protect a wiring constituting a circuit from moisture or the like. Also, the redistribution layer is composed of a conductive film containing copper as a main component and a barrier metal film formed between the conductive film and the organic insulating film. However, in a region between adjacent redistribution layers, the barrier metal film is not completely removed and remains on the organic insulating film in the manufacturing process in some cases. As a result, according to the studies by the inventor of the present invention, the leakage occurs between the adjacent redistribution layers and the lifetime between the adjacent redistribution layers in the HAST (Highly Accelerated Temperature and Humidity Stress Test) is deteriorated.

Also, because of a reaction between a material of the barrier metal film and a material of the organic insulating film, there arises a problem that a high resistance conductive material is contained in the barrier metal film, with the result that the resistance of the entire redistribution layer increases.

Further, a structure of an interlayer insulating film around the redistribution layer is soft because an organic insulating film such as polyimide is used, and a mechanical strength of the redistribution layer is low. Thus, there arises a problem that the redistribution layer is deformed due to, for example, an impact at the time of forming a bonding wire on the redistribution layer or an impact at the time of mounting a bump electrode formed on the redistribution layer onto a wiring board or the like or a crack is likely to be formed in the redistribution layer.

Other problems and novel features of the present invention will be apparent from the description of the present specification and the accompanying drawings.

The following is a brief description of an outline of a typical embodiment disclosed in the present application.

A semiconductor device and a manufacturing method thereof according to an embodiment include: a first pad electrode formed in an uppermost wiring layer of a multilayer wiring layer; a first insulating film formed on the first pad electrode; and a first organic insulating film formed over the first insulating film. Also, the semiconductor device and the manufacturing method thereof include: a first barrier metal film formed over the first organic insulating film and connected to the first pad electrode; and a first conductive film formed over the first barrier metal film. Then, a second insulating film made of an inorganic material is formed on an upper surface of the first organic insulating film between the first barrier metal film and the first organic insulating film.

According to the embodiment, it is possible to improve the reliability of the semiconductor device. Also, it is possible to improve the performance of the semiconductor device.

BRIEF DESCRIPTIONS OF THE DRAWINGS

DESCRIPTIONS OF THE PREFERRED EMBODIMENTS

Figure 1:
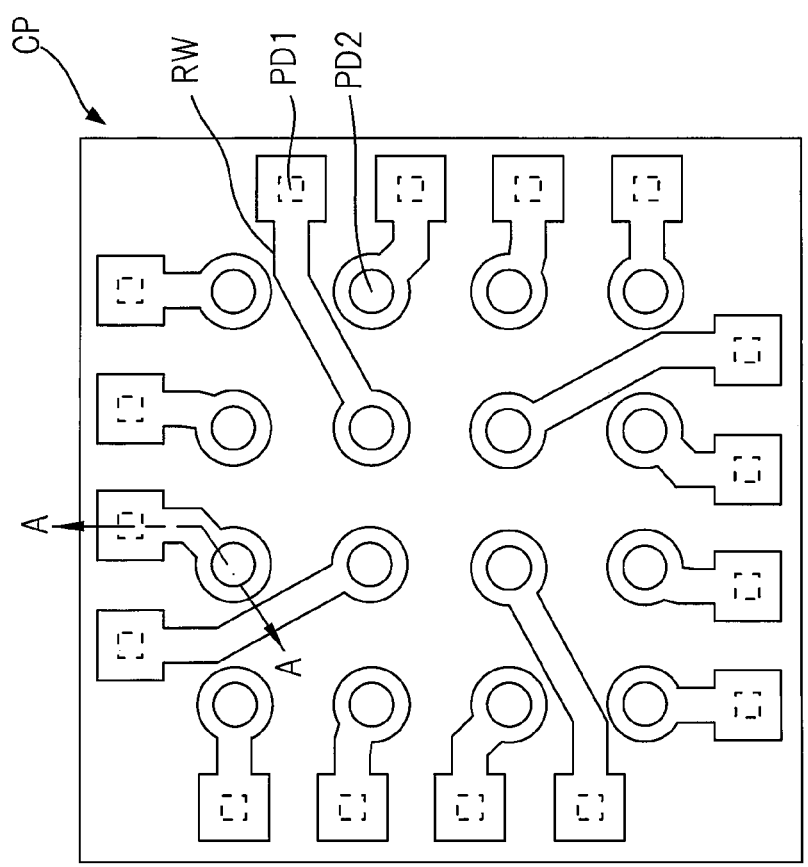
FIG. 1 is a plan view showing a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the constituent elements (including element steps) are not always indispensable unless otherwise stated or except the case where the constituent elements are apparently indispensable in principle.

Similarly, in the embodiments described below, when the shape of the constituent elements, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same members are denoted by the same reference characters in principle throughout the drawings for describing the embodiments, and the repetitive description thereof is omitted. In addition, hatching is used even in a plan view so as to make the drawings easy to see.

<Matters to be Studied by Inventor>

First, problems found by the studies by the inventor of the present invention will be described with reference to FIG. 18 and FIG. 19.

Figure 18:
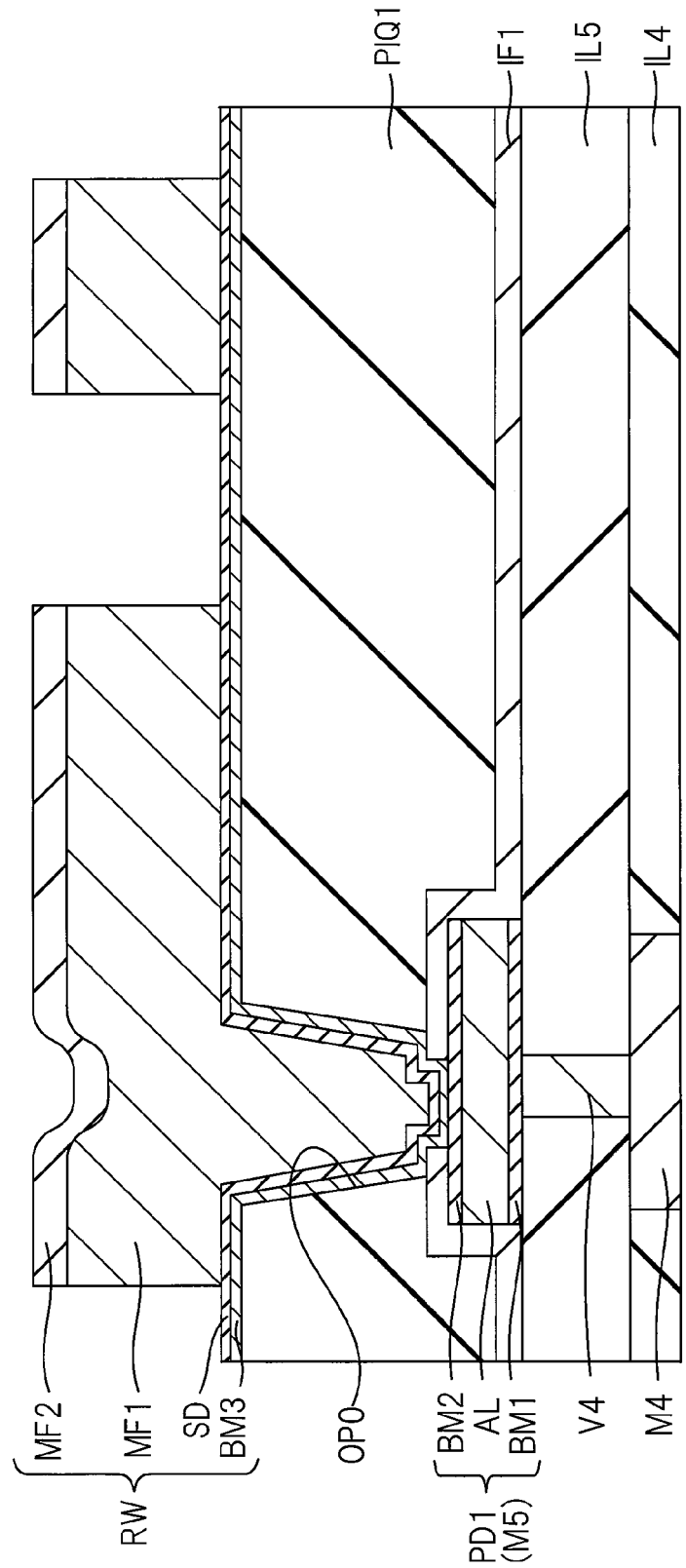
FIG. 18 is a cross-sectional view showing a semiconductor device according to a study example.

FIG. 18 is a cross-sectional view showing a manufacturing process for forming a redistribution layer RW. A part of a fifth wiring M5 which is an uppermost layer wiring of a multilayer wiring layer constitutes a first pad electrode PD1. On the first pad electrode PD1, an insulating film IF1 made of an inorganic material is formed so as to expose a part of the first pad electrode PD1. An organic insulating film PIQ1 composed of, for example, a polyimide film is formed over the insulating film IF1. The organic insulating film PIQ1 has an opening OP0 formed therein, and the redistribution layer RW is connected to the first pad electrode PD1 through the opening OP0. A barrier metal film BM3 and a seed layer SD are formed in the opening OP0 and over the organic insulating film PIQ1 by the sputtering method. Then, a conductive film MF1 and a conductive film MF2 are sequentially formed over the seed layer SD.

Figure 19:
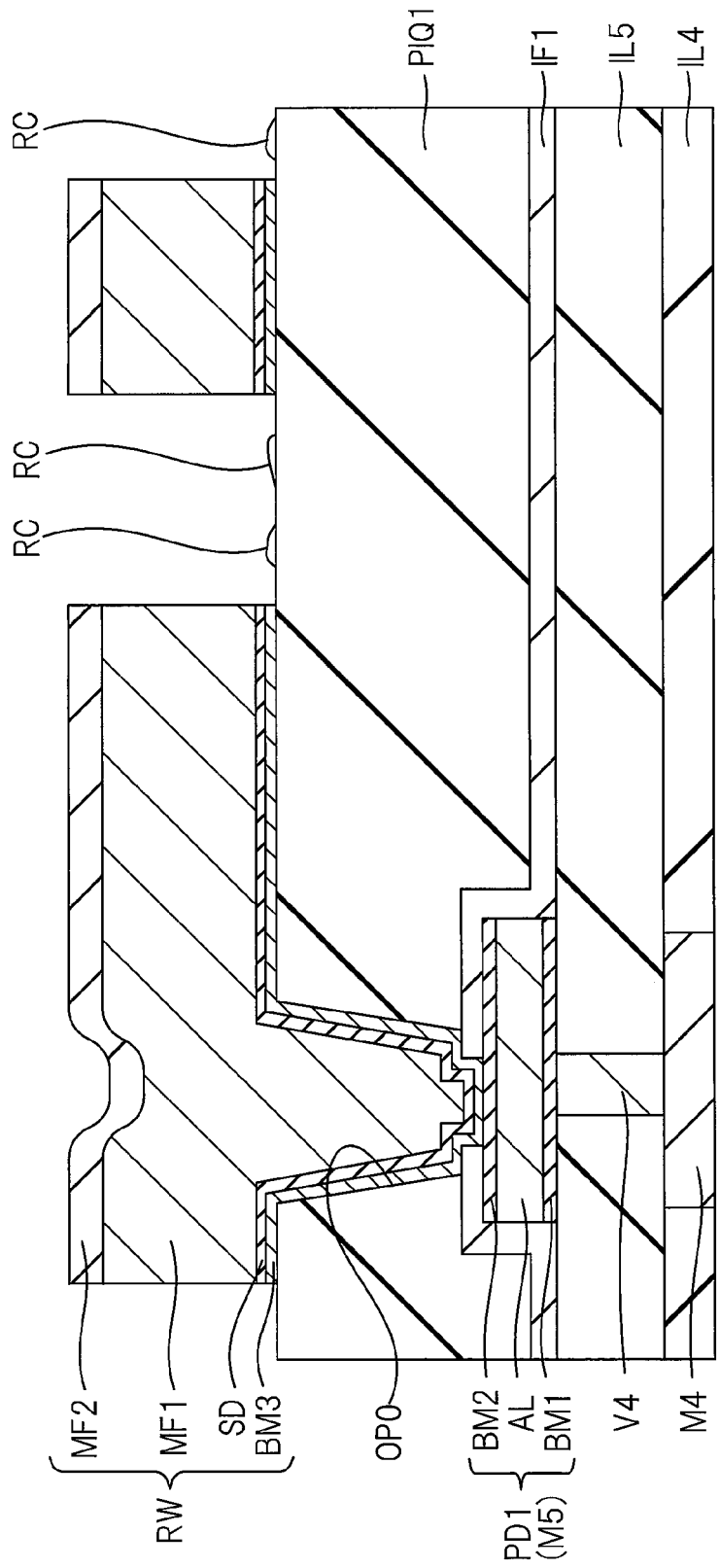
FIG. 19 is a cross-sectional view showing the semiconductor device according to the study example.

Subsequently, as shown in FIG. 19, the seed layer SD and the barrier metal film BM3 are removed in a region where the conductive film MF1 is not formed. At this time, the barrier metal film BM3 partially remains on the organic insulating film PIQ1 in some cases. Due to the presence of the barrier metal film BM3 left between adjacent redistribution layers RW (between conductive films IF1), there arises a problem of the occurrence of leakage between the redistribution layers RW and the deterioration of the lifetime in the HAST.

The consideration about the cause of such a problem by the inventor of the present invention will be described below. In the following description, the case where titanium is used as a material of the barrier metal film BM3 and polyimide containing carbon such as C—H bond is used as a material of the organic insulating film PIQ1 is taken as an example.

The titanium of the barrier metal film BM3 is formed over the organic insulating film PIQ1 by the sputtering method, and a part of the titanium reacts with the carbon contained in the polyimide, so that a reaction product RC such as titanium carbide is formed in some cases. This is because gas such as argon is used in an initial stage of the sputtering method and the C—H bond on the surface of the polyimide is weakened due to the exposure to the argon. Thus, titanium and polyimide are likely to react with each other in this state.

The occurrence of the reaction product RC in the manufacturing process is not expected, and it is thus difficult to completely remove the reaction product RC by normal wet etching for removing titanium.

Furthermore, the reaction product RC has conductivity. Therefore, if the reaction product RC remains between the adjacent redistribution layers RW, there arises a problem that leakage is likely to occur between the adjacent redistribution layers RW.

In another case, the organic insulating film PIQ1 reacts with a part of the barrier metal film BM3 below the conductive film MF1. Since titanium carbide generated by this reaction has higher resistance than titanium, the resistance of the barrier metal film BM3 is increased. Namely, there arises a problem that the resistance of the entire redistribution layer RW is increased.

Therefore, when the organic insulating film PIQ1 made of polyimide or the like is used for the redistribution layer RW, it is important to suppress the generation of the reaction product RC as much as possible.

First Embodiment

The semiconductor device according to the present embodiment and subsequent embodiment is a semiconductor device having a redistribution layer.

<Structure of Semiconductor Device>

Figure 2:
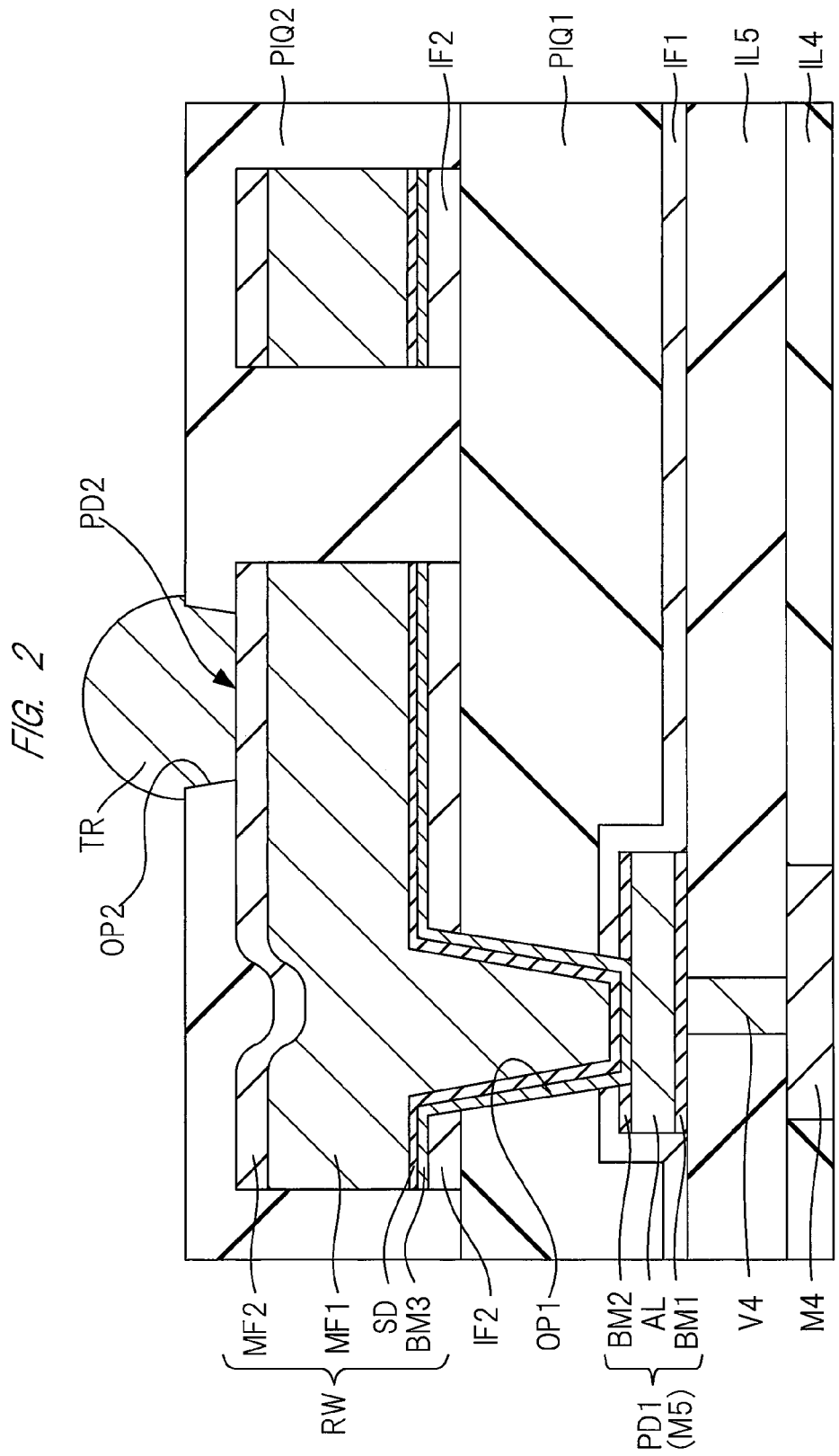
FIG. 2 is a cross-sectional view showing the semiconductor device according to the first embodiment.

The structure of the semiconductor device according to the present embodiment will be described with reference to FIG. 1 and FIG. 2. FIG. 1 is a planar layout of a semiconductor chip which is the semiconductor device according to the present embodiment. FIG. 2 is a cross-sectional view showing a principal part taken along a line A-A of FIG. 1.

As shown in FIG. 1, a semiconductor chip CP according to the present embodiment has a rectangular shape in a plan view. Each of the plurality of redistribution layers RW formed in the semiconductor chip CP is connected to a multilayer wiring layer through the first pad electrode PD1. A part of the redistribution layer RW constitutes a second pad electrode PD2. The second pad electrode PD2 is a region to be connected to an external connection terminal TR such as a bump electrode and a bonding wire. Note that, in order to make the shape of the redistribution layer RW easier to see, the external connection terminal TR and an organic film PIQ2 formed on the redistribution layer RW are omitted in FIG. 1. In addition, since the first pad electrode PD1 is actually covered with the redistribution layer RW, it is indicated by a broken line.

As shown in FIG. 2, in an upper part of the semiconductor chip CP, a fourth wiring M4 having a so-called damascene structure is formed in an interlayer insulating film IL4. Namely, the fourth wiring M4 is formed by filling a trench formed in the interlayer insulating film IL4 with a conductive film containing copper as a main component. Note that FIG. 2 shows the structure of the fourth wiring M4 and its upper layers for the sake of simplicity of description, and the structure of the layers below the fourth wiring M4 is not shown. The structure of the lower layers and the manufacturing method thereof will be described later with reference to FIG. 3.

An interlayer insulating film IL5 is formed on the fourth wiring M4, and a via V4 is formed in the interlayer insulating film IL5. Note that the interlayer insulating film IL5 is made of, for example, silicon oxide or silicon oxide to which fluorine is added, and the via V4 is composed of, for example, a conductive film containing tungsten as a main component.

The fifth wiring M5 is formed on the interlayer insulating film IL5, and the fifth wiring M5 and the fourth wiring M4 are connected through the via V4. The plurality of wirings M5 are formed in the uppermost layer of the multilayer wiring layer, and a part of the fifth wiring M5 serves as the first pad electrode PD1. The first pad electrode PD1 is composed of a barrier metal film BM1, a conductive film AL formed on the barrier metal film BM1, and a barrier metal film BM2 formed on the conductive film AL. Each of the barrier metal film BM1 and the barrier metal film BM2 mentioned here is composed of a titanium nitride film or a stacked film of a titanium nitride film and a titanium film. In addition, the conductive film AL is composed of a conductive film containing aluminum as a main component.

The insulating film IF1 is formed on the first pad electrode PD1 and the interlayer insulating film IL5. The insulating film IF1 is made of a material having high moisture resistance mainly for the purpose of preventing penetration of moisture, for example, silicon nitride or silicon oxynitride. Further, the organic insulating film PIQ1 made of, for example, polyimide is formed over the insulating film IF1.

An insulating film IF2 is formed on a part of a surface of the organic insulating film PIQ1. The insulating film IF2 is made of an inorganic material, for example, silicon oxide or silicon nitride. In other words, the insulating film IF2 is made of a material having a hardness higher than any of the organic insulating film PIQ1 and the organic insulating film PIQ2. Although described in detail later, it is preferable that the insulating film IF2 is made of a material different from that of the insulating film IF1 in the present embodiment. For example, when the insulating film IF1 is made of silicon nitride, it is preferable that the insulating film IF2 is made of silicon oxide.

The insulating film IF2 on the first pad electrode PD1 is partially removed, and an opening OP1 is formed in the stacked film including the organic insulating film PIQ1 and the insulating film IF1 so as to reach the first pad electrode PD1.

Also, the present embodiment illustrates the case where the barrier metal film BM2 at the bottom of the opening OP1 is removed. The barrier metal film BM2 is made of a material having a resistance higher than that of the conductive film AL. Accordingly, since the redistribution layer RW can be directly connected to the conductive film AL, the resistance between the first pad electrode PD1 and the redistribution layer RW can be reduced. Although it is not always necessary to remove the barrier metal film BM2, it is effective to remove the barrier metal film BM2 when it is desired to reduce the resistance between the redistribution layer RW and the first pad electrode PD1.

The redistribution layer RW is formed on the insulating film IF2 so as to fill the inside of the opening OP1 and is connected to the first pad electrode PD1. The redistribution layer RW is mainly composed of the conductive film MF1 and the barrier metal film BM3. In the present embodiment, the redistribution layer RW composed of the barrier metal film BM3, the seed layer SD formed on the barrier metal film BM3, the conductive film MF1 formed on the seed layer SD, and the conductive film MF2 formed on the conductive film MF1 is shown by way of example.

The conductive film MF1 and the seed layer SD are each composed of a conductive film and are made of, for example, a material containing copper as a main component. Although the seed layer SD is ultimately taken in and integrated with the conductive film MF1, they are separately shown in order to facilitate understanding of the present invention.

The conductive film MF2 is made of a material different from that of the conductive film MF1, and is made of, for example, nickel. Alternatively, the conductive film MF2 may be a stacked film of a nickel film and a gold film. The conductive film MF2 is a film provided to improve the adhesion to the external connection terminal TR, and it is not necessary to form the conductive film MF2 when a desired adhesion can be obtained. Namely, the adhesion between the conductive film MT2 and the external connection terminal TR is higher than the adhesion between the conductive film MF1 and the external connection terminal TR. Also, in order to reduce the resistance of the entire redistribution layer RW, the conductive film MF1 is made of a material having a sheet resistance lower than that of the conductive film MF2, and is formed to have a thickness larger than that of the conductive film MF2. In addition, for the same reason, the conductive film MF1 is made of a material having a sheet resistance lower than that of the barrier metal film BM3, and is formed to have a thickness larger than that of the barrier film BM3.

The barrier metal film BM3 is a conductive film containing, for example, titanium, tantalum, or chromium, and has a function to prevent the diffusion of the conductive film MF1 (copper). Also, the barrier metal film BM3 may be a single-layer film of the above-mentioned material, and may be a stacked film in which a nitride film such as a titanium nitride film or a tantalum nitride film is additionally formed.

The organic insulating film PIQ2 is formed over the redistribution layer RW and the organic insulating film PIQ1. The organic insulating film PIQ2 is made of the same material as that of the organic insulating film PIQ1, and is composed of an insulating film made of, for example, polyimide. Here, a part of the redistribution layer RW is a region to be connected to the external connection terminal TR and is shown as the second pad electrode PD2 in the present embodiment. An opening OP2 is formed in the organic insulating film PIQ2 so as to expose the region of the part of the redistribution layer RW, that is, the second pad electrode PD2.

The external connection terminal TR is connected to the redistribution layer RW through the opening OP2. The external connection terminal TR is, for example, a bump electrode or a bonding wire. For example, solder or gold can be used as a material of the bump electrode, and copper or gold can be used as a material of the bonding wire. Note that the present embodiment shows the case where the bump electrode is used as the external connection terminal TR by way of example.

Although the present embodiment shows the case where the organic insulating film PIQ2 is used byway of example, the formation of the organic insulating film PIQ2 may be omitted. Namely, the external connection terminal TR may be formed directly on the second pad electrode of the redistribution layer RW without forming the organic insulating film PIQ2. However, since the resistance to penetration of moisture from the outside and the like can be improved when the organic insulating film PIQ2 is formed, it is better to form the organic insulating film PIQ2 when it is desired to further improve the reliability of the product.

In addition, the insulating film IF2 in the region exposed from the redistribution layer RW is removed in the present embodiment. Namely, the insulating film IF2 is removed in the region between the adjacent redistribution layers RW. This is because the adhesion between the organic insulating film PIQ1 and the organic insulating film PIQ2 is higher than the adhesion between the insulating film IF2 and the organic insulating film PIQ1 or the adhesion between the insulating film IF2 and the organic insulating film PIQ2. Accordingly, it is possible to reduce the fear of the delamination of the organic insulating film PIQ2. Note that it is better to remove the insulating film IF2 between the redistribution layers RW also when the organic insulating film PIQ2 is not used.

<Main Feature of Structure of Semiconductor Device>

The main feature of the structure of the semiconductor device according to the present embodiment is that the insulating film IF2 made of an inorganic material is formed between the organic insulating film PIQ1 and the barrier metal film BM3. This prevents the barrier metal film BM3 from being in contact with the organic insulating film PIQ1 on the upper surface of the organic insulating film PIQ1, so that the conductive reaction product RC made by the reaction between the C—H bond constituting the organic insulating film PIQ1 and the barrier metal film BM3 is not formed.

Therefore, no reaction product RC is generated on the organic insulating film PIQ1 between the adjacent redistribution layers RW. Accordingly, it is possible to prevent such problems as the occurrence of the leakage between the redistribution layers RW and the deterioration of the HAST lifetime between the redistribution layers RW. As a result, it is possible to improve the reliability of the semiconductor device.

Also, since a part of the barrier metal film BM3 below the conductive film MF1 does not react with the organic insulating film PIQ1, a high-resistance material such as titanium carbide is no longer formed. Since the insulating film IF2 is made of an inorganic material, metal carbide such as titanium carbide is not formed even when the barrier metal film BM3 comes in contact with the insulating film IF2. Accordingly, it is possible to prevent the increase of the resistance of the barrier metal film BM3, and it is thus possible to suppress such a problem of the increase of the resistance of the entire redistribution layer RW. As a result, it is possible to improve the performance of the semiconductor device.

Conventionally, the structure of the interlayer insulating film around the redistribution layer RW is composed of the organic insulating film PIQ1 and the organic insulating film PIQ2, and the mechanical strength of the redistribution layer RW is low. Thus, there arises a problem that the redistribution layer RW is deformed or a crack is formed in the redistribution layer RW due to, for example, an impact at the time of forming the bonding wire on the redistribution layer RW or an impact at the time of mounting the bump electrode on the wiring board. However, by forming the insulating film IF2, which is made of an inorganic material having a hardness higher than any of the organic insulating film PIQ1 and the organic insulating film PIQ2, between the barrier metal film BM3 below the conductive film MF1 and the organic insulating film PIQ1 as in the present invention, the mechanical strength of the redistribution layer RW can be improved. As a result, it is possible to improve the reliability of the semiconductor device.

<Manufacturing Method of Semiconductor Device>

Figure 3:
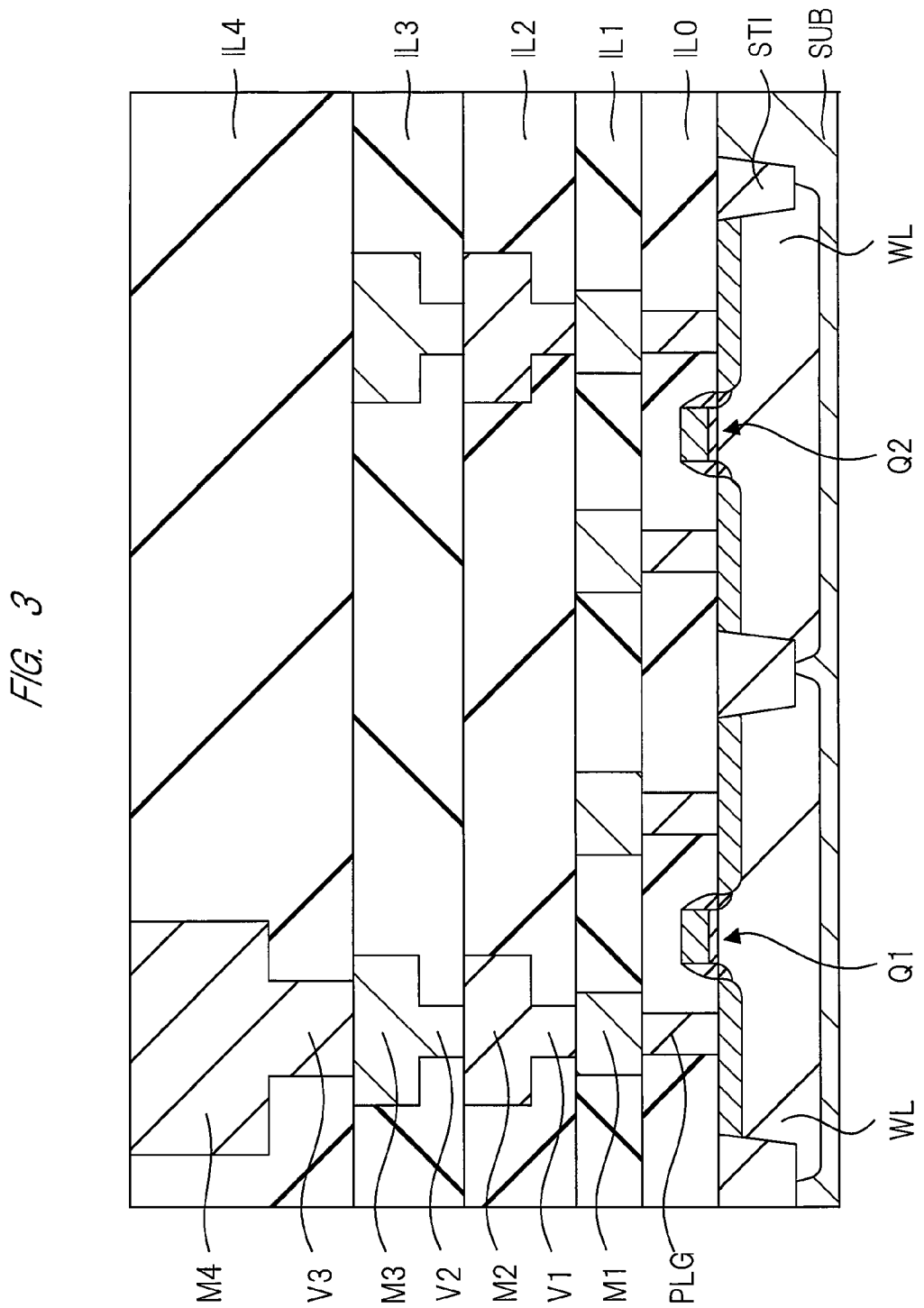
FIG. 3 is a cross-sectional view showing the semiconductor device according to the first embodiment.

The manufacturing method of the semiconductor device according to the present embodiment will be described with reference to FIG. 3 to FIG. 13. FIG. 3 is a cross-sectional view showing the structure of the fourth wiring M4 and its lower layers, and FIG. 4 to FIG. 13 are cross-sectional views each showing the structure of the fourth wiring M4 and its upper layers. Note that these cross-sectional views correspond to the cross section taken along the line A-A of FIG. 1 like FIG. 2.

Also, the case where the multilayer wiring layer is composed of five wiring layers will be described here, but the number of wiring layers to be stacked may be larger than or smaller than five. In addition, since the main feature of the present embodiment lies in the structure above the multilayer wiring layer and the manufacturing method thereof, the description of the specific manufacturing method of semiconductor elements formed in the vicinity of the main surface of the semiconductor substrate is partially omitted.

First, as shown in FIG. 3, a semiconductor substrate (semiconductor wafer) SUB made of, for example, p type single crystal silicon having a specific resistance of 1 to 10 Ωcm is prepared. Then, a plurality of element isolation regions STI which define active regions are formed in the semiconductor substrate SUB. The element isolation region STI is formed by, for example, filling a trench formed in the semiconductor substrate SUB with an insulating film containing silicon oxide as a main component.

Subsequently, after an impurity is introduced into the semiconductor substrate SUB to form a well WL, a MISFET Q1 and a MISFET Q2 each including a gate electrode formed on the well WL with a gate insulating film interposed therebetween and source/drain regions formed in the well WL are formed.

Subsequently, an interlayer insulating film IL0 which covers the MISFET Q1 and the MISFET Q2 is formed over the semiconductor substrate SUB. The interlayer insulating film IL0 is composed of, for example, a silicon oxide film and can be formed by, for example, the CVD method. Then, contact holes are formed in the interlayer insulating film IL0 by the photolithography technique and the dry etching method. Thereafter, plugs PLG are formed by filling the contact holes with a metal film made of, for example, tungsten. The plugs PLG are connected to the MISFET Q1, the MISFET Q2, and the like.

Subsequently, an interlayer insulating film IL1 is formed over the interlayer insulating film IL0 in which the plugs PLG have been embedded. The interlayer insulating film IL1 is made of a material having a dielectric constant lower than that of silicon oxide, for example, silicon oxide containing carbon such as SiOC. A first wiring M1 is formed by using the so-called damascene technique. Namely, the first wiring M1 is formed by forming a trench in the interlayer insulating film IL1 and filling the trench with, for example, a conductive film containing copper as a main component by the CMP (Chemical Mechanical Polishing) method. Note that a barrier metal film for preventing the diffusion of copper may be formed between the copper and the interlayer insulating film IL1. Note that the first wiring M1 is connected to the upper surface of the plug PLG.

Subsequently, an interlayer insulating film IL2 is formed over the interlayer insulating film IL1 so as to cover the first wiring M1. The interlayer insulating film IL2 is made of the same material as that of the interlayer insulating film IL1. In addition, a barrier insulating film having a function to prevent the diffusion of copper and made of, for example, silicon carbonitride is formed on the surface of the first wiring M1, but illustration thereof is omitted here. Next, a via V1 and a second wiring M2 are formed by forming a via hole and a wiring trench in the interlayer insulating film IL2 and filling the via hole and the trench with, for example, a conductive film containing copper as a main component by the CMP method. Namely, the via V1 and the second wiring M2 are formed by the dual damascene method which is one type of the damascene method, and are integrated with each other. Note that a barrier metal film for preventing the diffusion of copper may be formed between the copper and the interlayer insulating film IL2. Note that the via V1 is connected to the upper surface of the first wiring M1.

Subsequently, an interlayer insulating film IL3 is formed over the interlayer insulating film IL2 and the second wiring M2. Then, a via V2 and a third wiring M3 are formed in the interlayer insulating film IL3 by using the same method as that when the via V1 and the second wiring M2 are formed. Subsequently, an interlayer insulating film IL4 is formed over the interlayer insulating film IL3 and the third wiring M3. Thereafter, a via V3 and a fourth wiring M4 are formed in the interlayer insulating film IL4 by using the same method as that when the via V1 and the second wiring M2 are formed. Note that materials of the interlayer insulating film IL3 and the interlayer insulating film IL4 are the same as that of the interlayer insulating film IL2.

Figure 4:
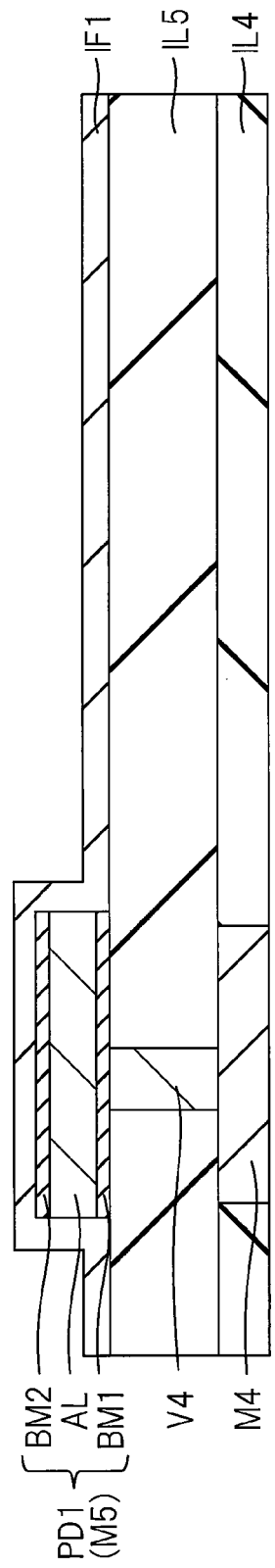
FIG. 4 is a cross sectional view showing a manufacturing process of the semiconductor device according to the first embodiment.

Subsequently, as shown in FIG. 4, the interlayer insulating film IL5 is formed over the interlayer insulating film IL4 so as to cover the fourth wiring M4. The interlayer insulating film IL5 is composed of an inorganic insulating film, and is made of, for example, silicon oxide or silicon oxide to which fluorine is added. Also, a barrier insulating film having a function to prevent the diffusion of copper and made of, for example, silicon carbonitride is formed on the surface of the fourth wiring M4, but illustration thereof is omitted here. Then, a via hole is formed in the interlayer insulating film IL5 by the photolithography technique and the dry etching method. Thereafter, the via V4 is formed by filling the via hole with a metal film made of, for example, tungsten. Note that the via V4 is connected to the upper surface of the fourth wiring M4.

Subsequently, the fifth wiring M5 is formed on the interlayer insulating film IL5. First, the barrier metal film BM1, the conductive film AL, and the barrier metal film BM2 are sequentially stacked over the interlayer insulating film IL5 by the CVD method or the sputtering method. Then, these films are patterned by the photolithography technique and the dry etching method, thereby forming the fifth wiring M5. The plurality of fifth wirings M5 are formed in the uppermost layer of the multilayer wiring layer, and a part of the fifth wiring M5 serves as the first pad electrode PD1. Each of the barrier metal film BM1 and the barrier metal film BM2 mentioned here is composed of a titanium nitride film or a stacked film of a titanium nitride film and a titanium film. In addition, the conductive film AL is composed of a conductive film containing aluminum as a main component. Further, a thickness of the barrier metal film BM1 is about 30 to 100 nm, a thickness of the conductive film AL is about 1 to 4 μm, and a thickness of the barrier metal film BM2 is about 30 to 100 nm. Although it is not always necessary to form the barrier metal film BM2, the case where the barrier metal film BM2 is formed will be described in the present embodiment. Note that the fifth wiring M5 (first pad electrode PD1) is connected to the upper surface of the via V4.

Subsequently, the insulating film IF1 is formed over the interlayer insulating film IL5 so as to cover the fifth wiring M5. The insulating film IF1 is an inorganic insulating film formed by the CVD method, and is made of, for example, silicon nitride or silicon oxynitride. Further, the insulating film IF1 may be composed of a stacked film including a silicon oxide film formed first and a silicon nitride film formed on the silicon oxide film. Note that the thickness of the insulating film IF1 is about 100 to 200 nm.

Through the process described above, the semiconductor substrate SUB, the multilayer wiring layer formed over the semiconductor substrate SUB, the first pad electrode PD1 formed in the uppermost wiring layer of the multilayer wiring layer, and the first insulating film IF1 formed so as to cover the first pad electrode PD1 and made of an inorganic material are prepared.

Figure 5:
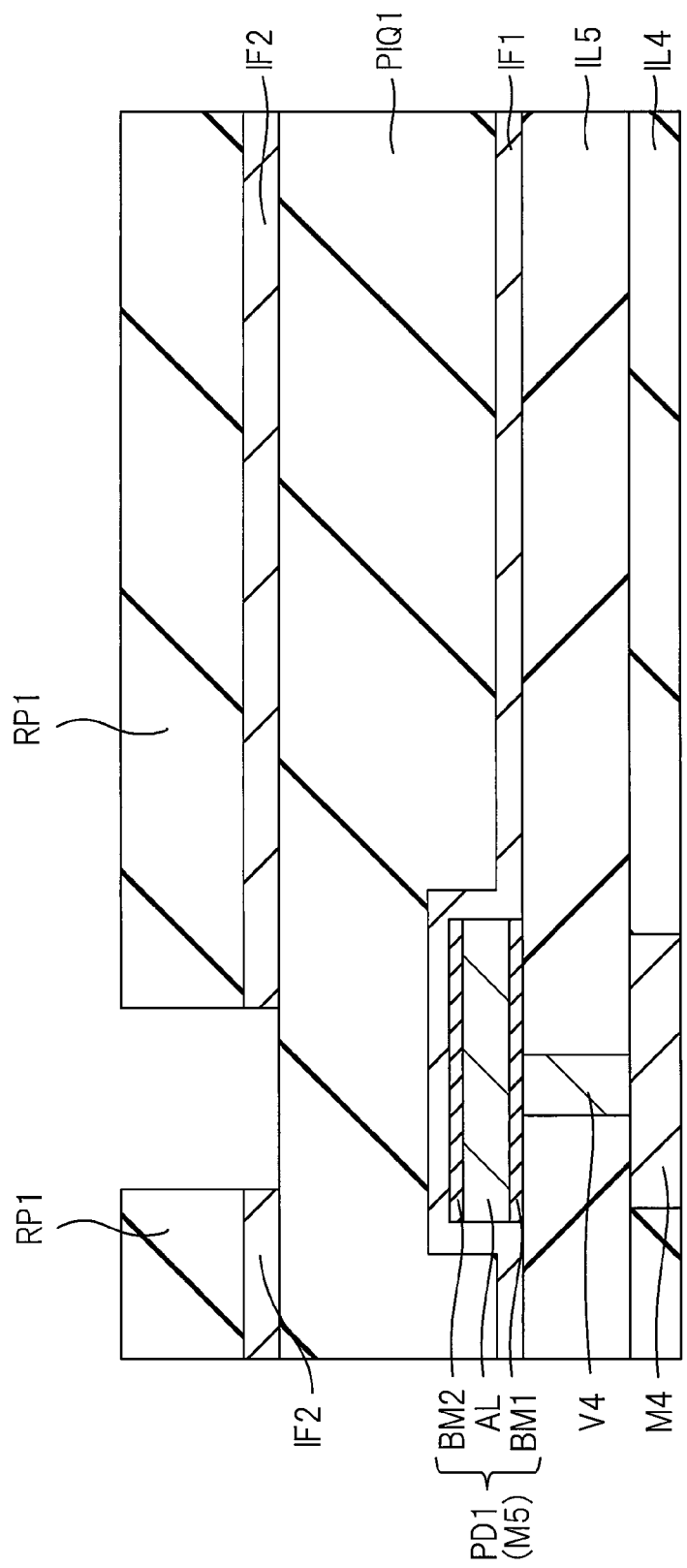
FIG. 5 is a cross-sectional view showing the manufacturing process of the semiconductor device continued from FIG. 4.

Subsequently, as shown in FIG. 5, the organic insulating film PIQ1 is formed over the insulating film IF1. The organic insulating film PIQ1 is an organic resin film formed by the coating method, and is made of, for example, polyimide. The thickness of the organic insulating film PIQ1 is about 3 to 7 μm. Thereafter, heat treatment is performed to cure the organic insulating film PIQ1.

Subsequently, the insulating film IF2 is formed over the organic insulating film PIQ1. The insulating film IF2 is an insulating film of an inorganic material formed by the low-temperature plasma CVD method, and is made of, for example, silicon oxide or silicon nitride. In addition, the insulating film IF2 is a material having a hardness higher than any of the organic insulating film PIQ1 and the organic insulating film PIQ2 to be described later. Further, it is preferable that the plasma CVD method used here is performed at a low temperature such that the composition of the organic insulating film PIQ1 is not decomposed, and is performed at, for example, 350° C. or lower. More preferably, the plasma CVD method is performed at about 200 to 300° C. Note that the thickness of the insulating film IF2 is about 100 to 500 nm.

Subsequently, a resist pattern RP1 is formed over the insulating film IF2, and the insulating film IF2 located on the first pad electrode PD1 is selectively removed by performing the etching process.

Figure 6:
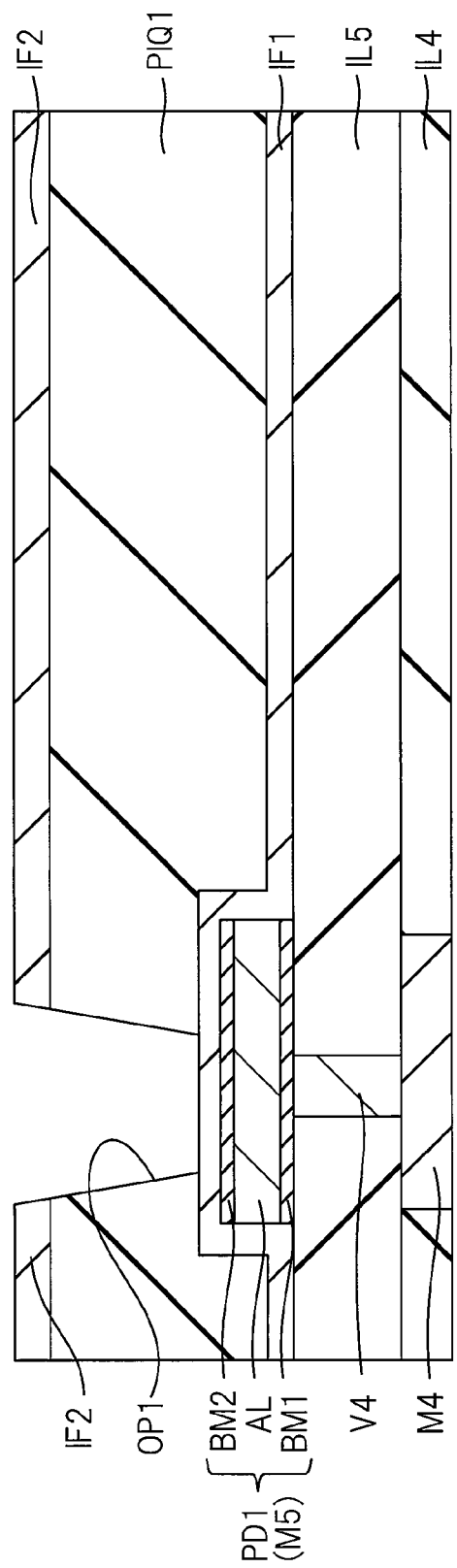
FIG. 6 is a cross-sectional view showing the manufacturing process of the semiconductor device continued from FIG. 5.

Subsequently, as shown in FIG. 6, the resist pattern RP1 and the organic insulating film PIQ1 located on the first pad electrode PD1 are removed. In other words, the resist pattern RP1 and the organic insulating film PIQ1 in the region not covered with the insulating film IF2 are removed. These can be removed at the same time by performing the dry etching process. In this manner, the insulating film IF1 on the first pad electrode PD1 is exposed.

Figure 7:
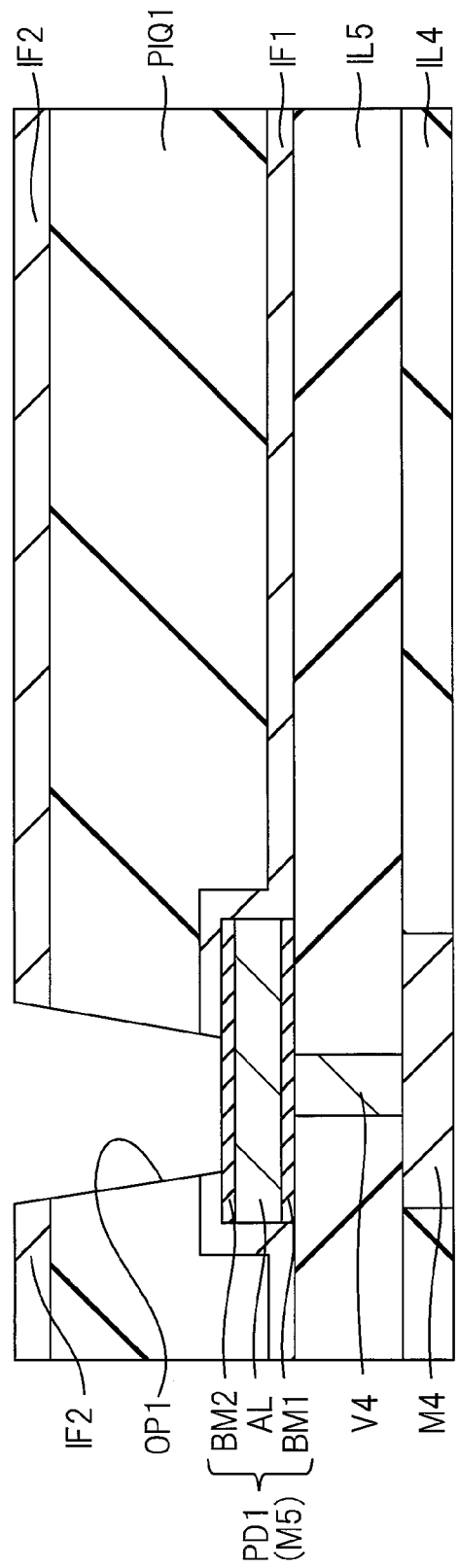
FIG. 7 is a cross-sectional view showing the manufacturing process of the semiconductor device continued from FIG. 6.

Subsequently, as shown in FIG. 7, the insulating film IF1 on the first pad electrode PD1 is partially removed to expose the first pad electrode PD1. As a result, the opening OP1 is formed in the insulating film IF2, the organic insulating film PIQ1, and the insulating film IF1. This step is performed by the dry etching or the wet etching under the condition that the insulating film IF1 is removed and the insulating film IF2 is not removed. Namely, the insulating film IF1 is etched with using the insulating film IF2 as a mask. At this time, by forming the insulating film IF1 and the insulating film IF2 from different materials, it is possible to impart selectivity to the etching. For example, when the insulating film IF1 is made of silicon nitride, the insulating film IF2 is formed of silicon oxide. When removing the silicon nitride by phosphoric acid or dry etching, the silicon oxide remains without being etched. Therefore, an additional mask is unnecessary when removing the insulating film IF1, and an increase in manufacturing process cost can be suppressed.

At this time, the barrier metal film BM2 at the bottom of the opening OP1 may also be removed. Although it is not always necessary to remove the barrier metal film BM2 as described above, it is effective to remove the barrier metal film BM2 when it is desired to reduce the resistance between the redistribution layer RW and the first pad electrode PD1. In the following description, the case where the barrier metal film BM2 at the bottom of the opening OP1 is removed is illustrated.

Also, in the present embodiment, the insulating film IF2, the organic insulating film PIQ1, the insulating film IF1, and the barrier metal film BM2 are etched with only one mask. Normally, the insulating film IF1 and the barrier metal film BM2 are etched to form an opening on the first pad electrode PD1 before forming the organic insulating film PIQ1. Thereafter, the organic insulating film PIQ1 is formed on the first pad electrode PD1, and then another opening is formed in the organic insulating film PIQ1 with another mask. As described above, according to the present embodiment, it is possible to reduce the number of masks when forming the opening OP1 on the first pad electrode PD1 as compared with the conventional technique.

Figure 8:
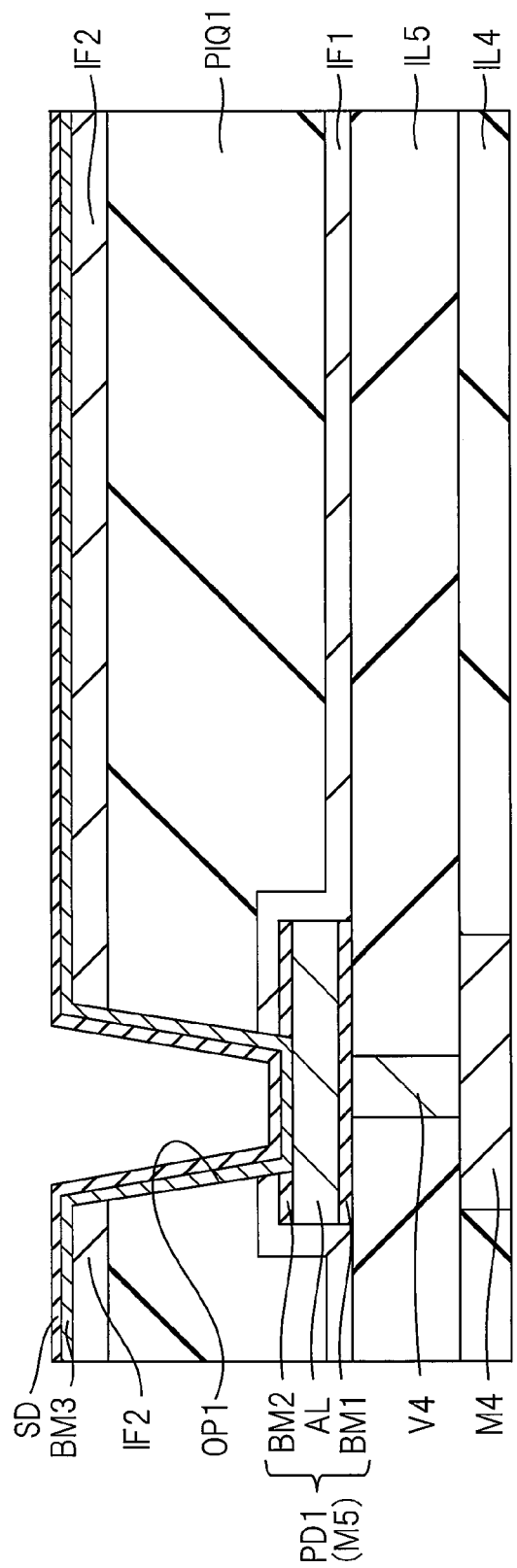
FIG. 8 is a cross-sectional view showing the manufacturing process of the semiconductor device continued from FIG. 7.

Subsequently, as shown in FIG. 8, the barrier metal film BM3 is formed over the insulating film IF2 and in the opening OP1 by the CVD method or the sputtering method. At this time, though the heat treatment at about 200 to 250° C. is applied, the upper surface of the organic insulating film PIQ1 is covered with the insulating film IF2, and thus there is no possibility that the reaction product RC formed by the reaction between the barrier metal film BM3 and the organic insulating film PIQ1 is generated. Further, since the insulating film IF2 is made of an inorganic material, the barrier metal film BM3 is less likely to react with the insulating film IF2, and no metal carbide is formed even if they react with each other. The barrier metal film BM3 is a conductive film containing, for example, titanium, tantalum, or chromium, and has a function to prevent the diffusion of the conductive film MF1 (copper). Also, the barrier metal film BM3 may be a single-layer film of the material mentioned above, and may be a stacked film in which a nitride film such as a titanium nitride film or a tantalum nitride film is additionally formed. Note that the thickness of the barrier metal film BM3 is about 50 to 200 nm. Next, the seed layer SD is formed over the barrier metal film BM3 by the sputtering method. The seed layer SD is made of the same material as that of the conductive film MF1 formed in the next step, and is made of, for example, copper. Note that the thickness of the seed layer SD is about 100 to 300 nm.

Figure 9:
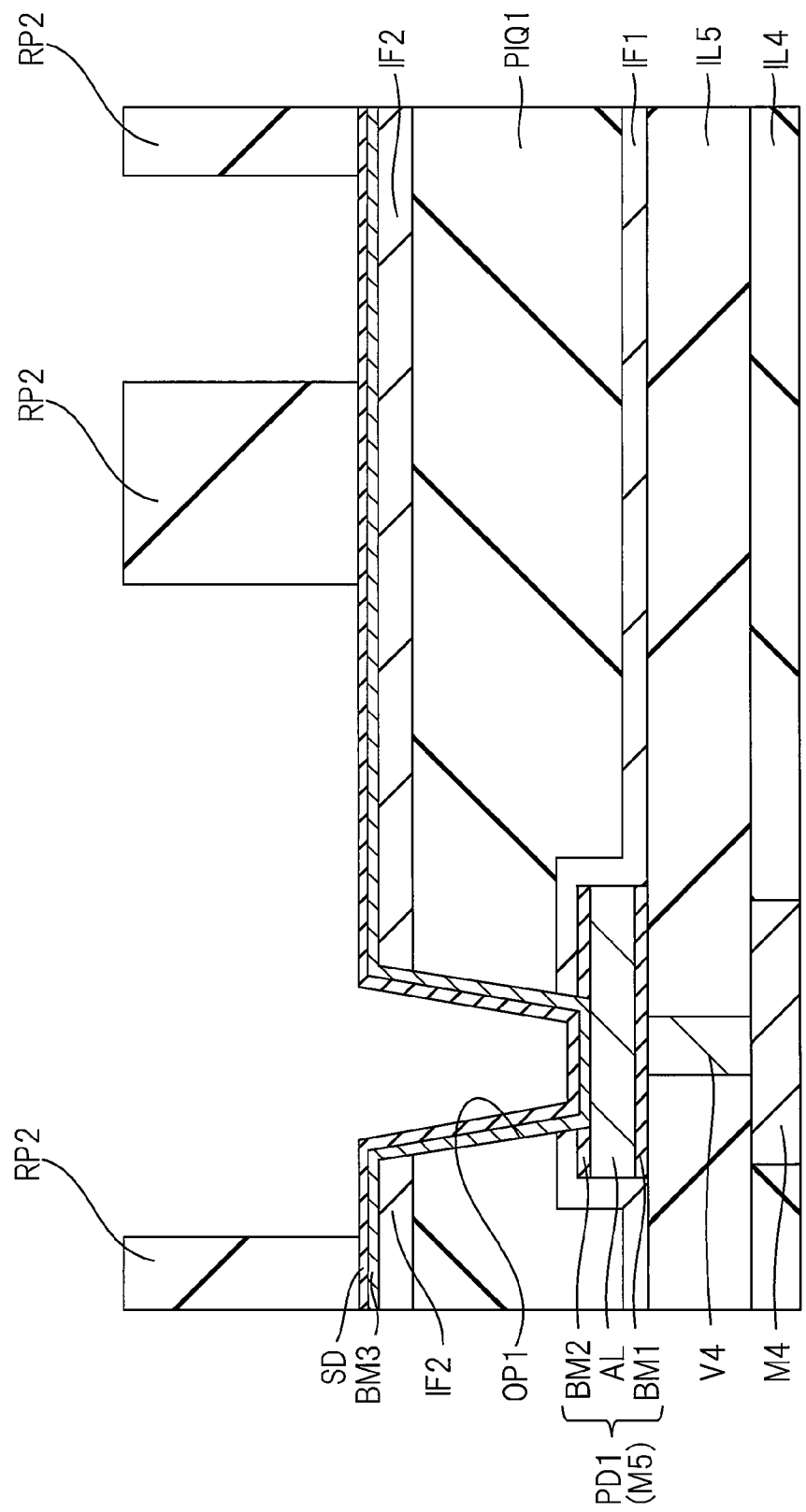
FIG. 9 is a cross-sectional view showing the manufacturing process of the semiconductor device continued from FIG. 8.

Subsequently, as shown in FIG. 9, a resist pattern RP2 having an opening corresponding to the region where the redistribution layer RW is to be formed is formed over the seed layer SD.

Figure 10:
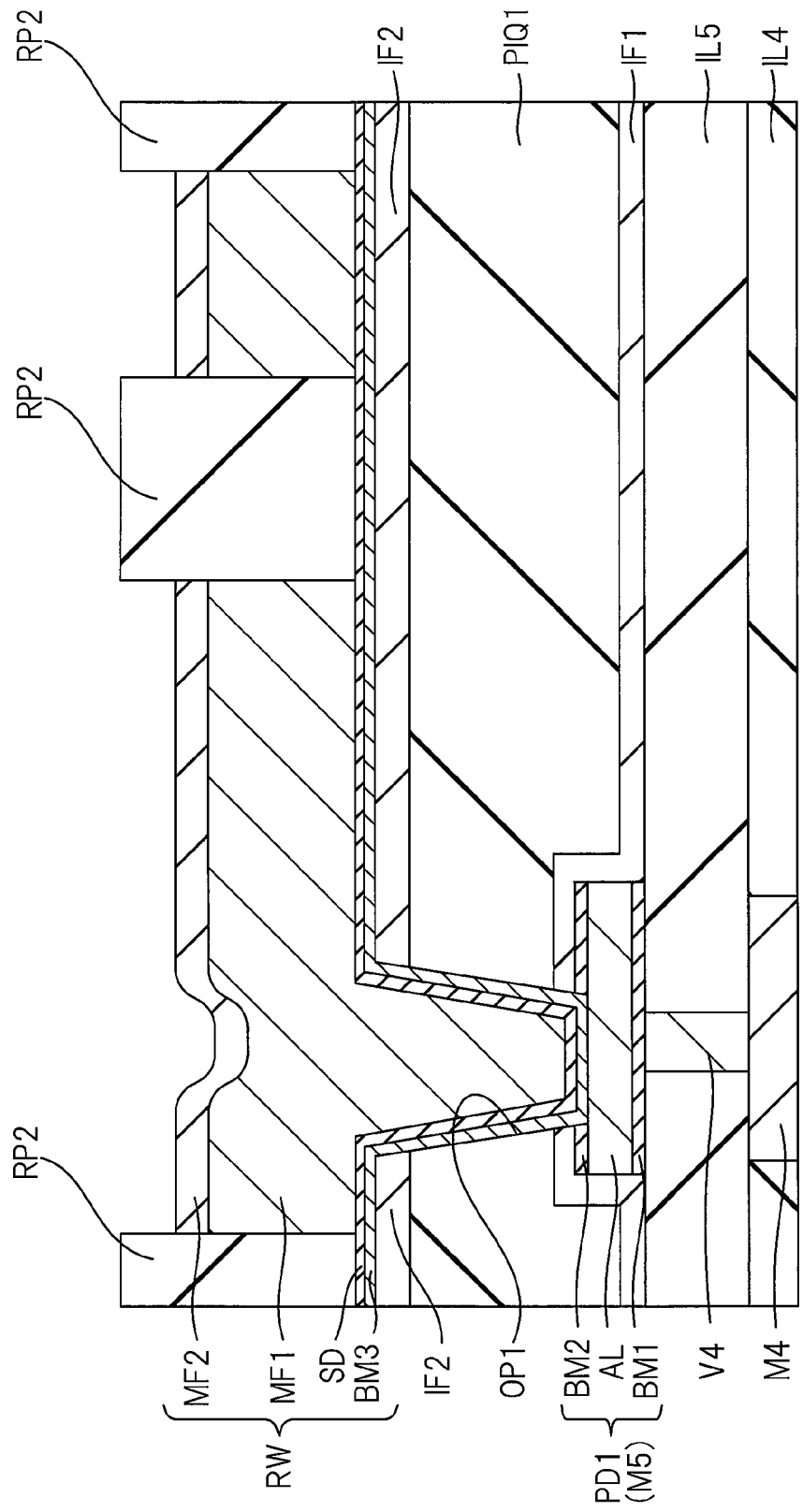
FIG. 10 is a cross-sectional view showing the manufacturing process of the semiconductor device continued from FIG. 9.

Subsequently, as shown in FIG. 10, the conductive film MF1 and the conductive film MF2 are formed. The conductive film MF1 is formed on the seed layer SD in the region exposed from the resist pattern RP2 by the plating method. Thereafter, by performing the plating method in the state where the resist pattern RP2 is present, the conductive film MF2 is formed over the conductive film MF1. The conductive film MF1 is a main part of the redistribution layer RW, is made of a material having a sheet resistance lower than that of the conductive film MF2 in order to reduce the resistance, and is made of, for example, copper. In addition, the thickness of the conductive film MF1 is larger than that of the conductive film MF2, and is, for example, about 5 to 10 μm.

The conductive film MF2 is made of a material different from that of the conductive film MF1, and is made of, for example, nickel. Alternatively, the conductive film MF2 may be a stacked film of a nickel film and a gold film. The conductive film MF2 is a film provided to improve the adhesion to the external connection terminal TR, and the adhesion between the conductive film MF2 and the external connection terminal TR is higher than the adhesion between the conductive film MF1 and the external connection terminal TR. The thickness of the conductive film MF2 is about to 4 μm. Note that it is not necessary to form the conductive film MF2 when the adhesion to the external connection terminal TR is sufficient.

Figure 11:
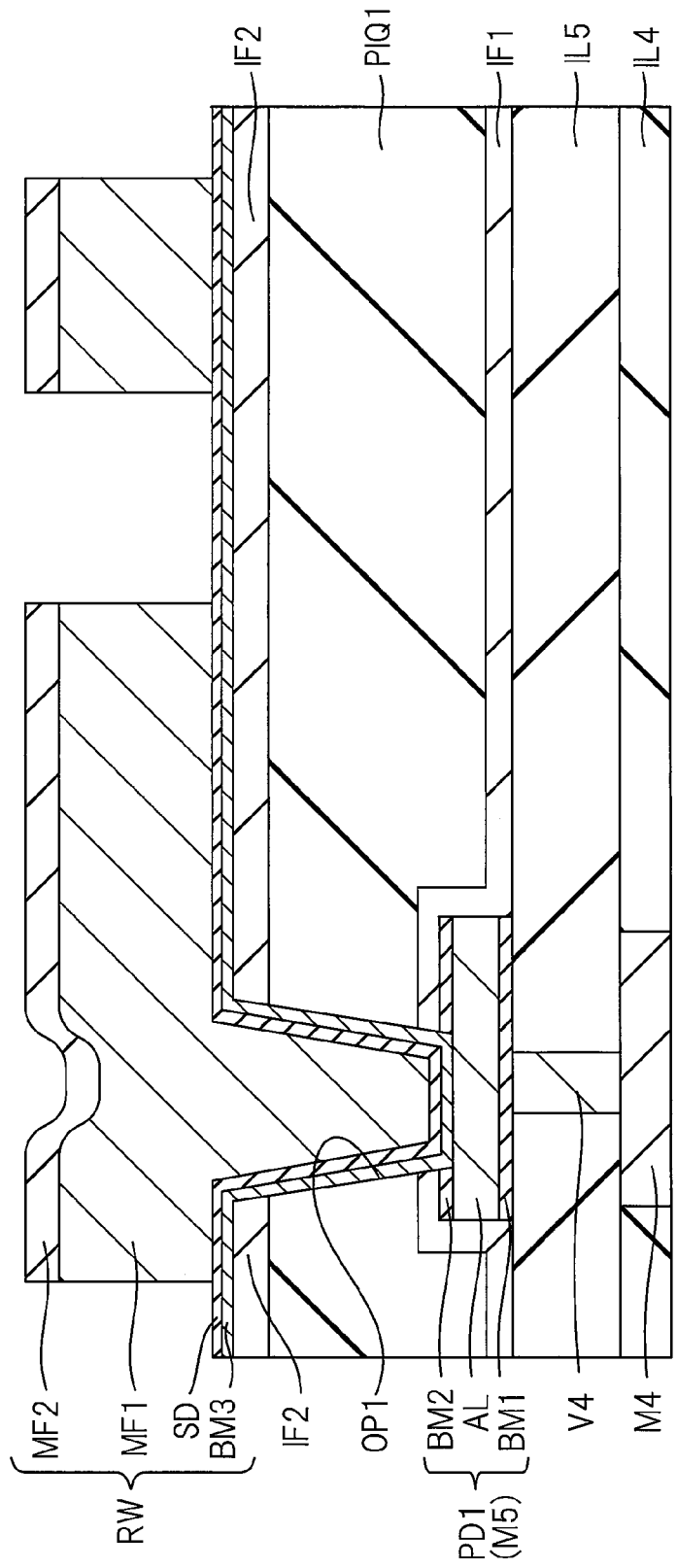
FIG. 11 is a cross-sectional view showing the manufacturing process of the semiconductor device continued from FIG. 10.
Figure 12:
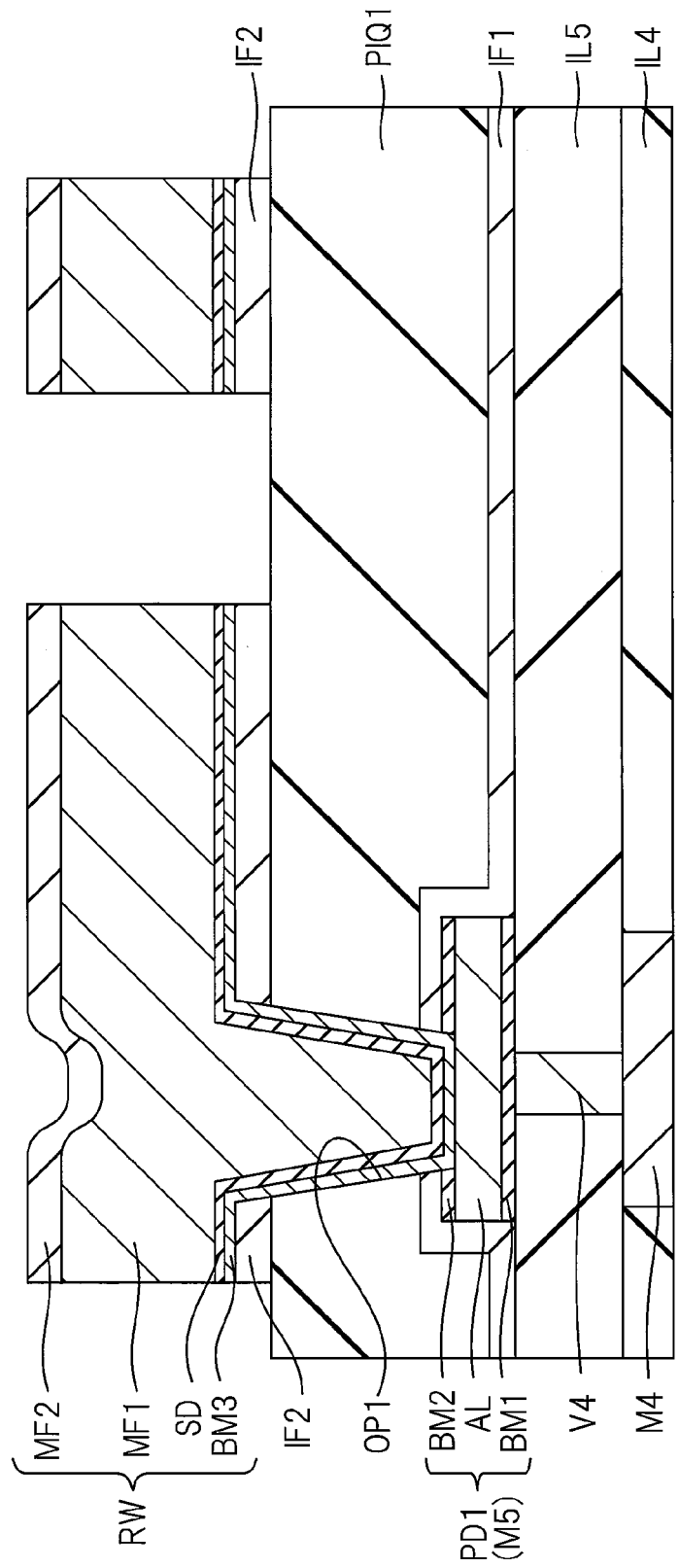
FIG. 12 is a cross-sectional view showing the manufacturing process of the semiconductor device continued from FIG. 11.

Subsequently, as shown in FIG. 11, the resist pattern RPG is removed by the asking process. Next, as shown in FIG. 12, the seed layer SD, the barrier metal film BM3, and the insulating film IF2 are sequentially removed by etching in the region exposed from the conductive film MF1 and the conductive film MF2 (region in which the conductive film MF1 and the conductive film MF2 are not formed). As a result, the redistribution layer RW is formed.

Note that the etching process of the insulating film IF2 is preferably performed by the wet etching. Compared with the case where the barrier metal film BM3 and the organic insulating film PIQ1 react with each other, the barrier metal film BM3 and the insulating film IF2 are less likely to react with each other. However, when taking into consideration that an extremely small reaction product is generated on the upper surface of the insulating film IF2, the insulating film IF2 and the reaction product formed on the upper surface of the insulating film IF2 can be removed together by using the wet etching. Namely, the reaction product can be removed by the so-called lift-off method. From this viewpoint as well, it is preferable to remove the insulating film IF2 in the region exposed from the redistribution layer RW.

Figure 13:
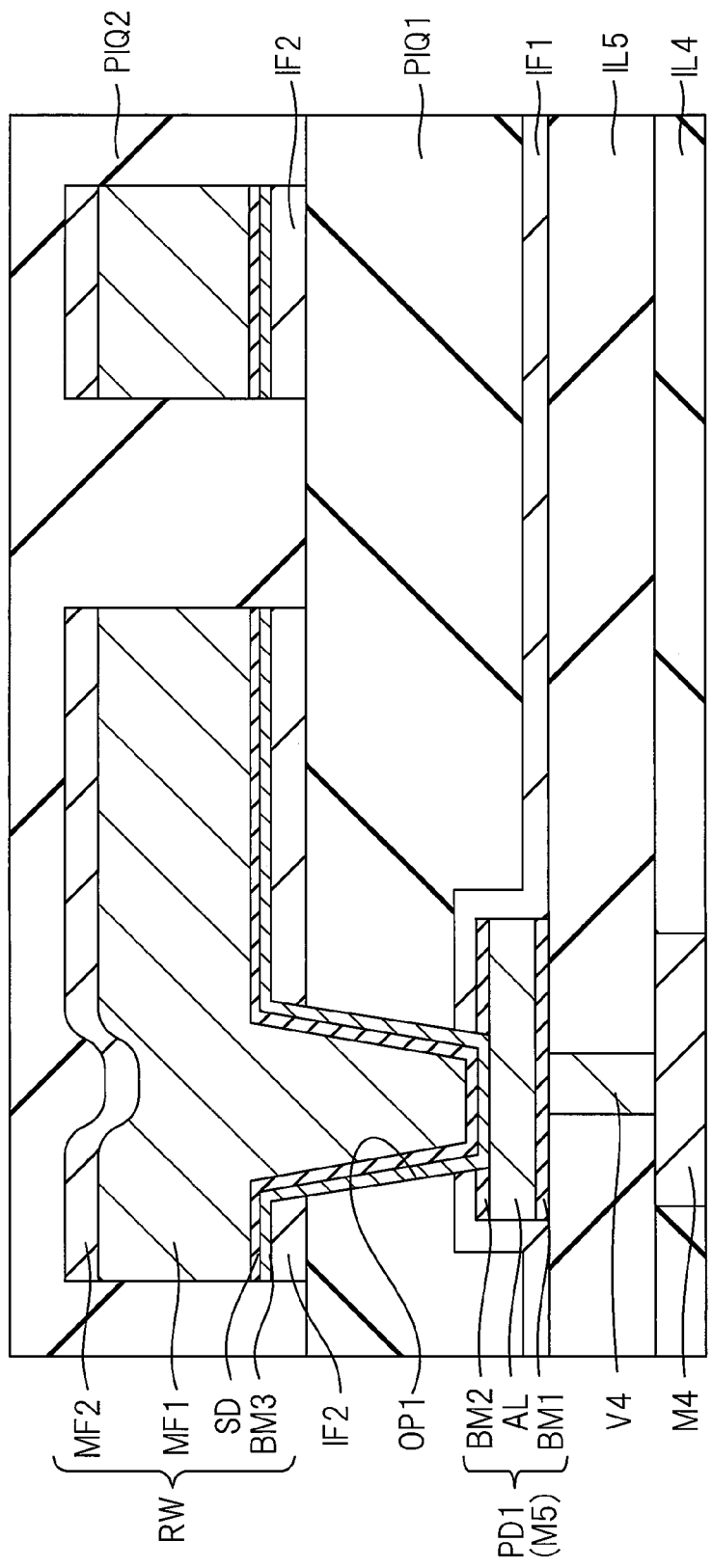
FIG. 13 is a cross-sectional view showing the manufacturing process of the semiconductor device continued from FIG. 12.

Subsequently, as shown in FIG. 13, the organic insulating film PIQ2 is formed over the organic insulating film PIQ1 so as to cover the redistribution layer RW. The organic insulating film PIQ2 is made of the same material as that of the organic insulating film PIQ1. It is preferable to remove the insulating film IF2 in the region exposed from the redistribution layer RW particularly when the organic insulating film PIQ2 is used. This is because when the insulating film IF2 remains between the adjacent redistribution layers RW, an interface is formed between the organic insulating film PIQ2 and the insulating film IF2, and difference occurs in the respective dielectric constants at the interface like this, so that the lines of electric force are not constant and electric field concentration tends to occur at an end of the redistribution layer RW. In other words, the interface tends to cause such problems as the leakage between the adjacent redistribution layers RW and the deterioration of the HAST lifetime between the redistribution layers RW. Therefore, in the present embodiment, the insulating film IF2 in the region exposed from the redistribution layer RW is removed.

In addition, by removing the insulating film IF2 in the region exposed from the redistribution layer RW, the organic insulating film PIQ1 and the organic insulating film PIQ2 can be brought into direct contact with each other. Accordingly, as compared with the case where the organic insulating film PIQ2 is formed on the insulating film IF2, the fear of the delamination of the organic insulating film PIQ2 can be reduced.

Note that it is not always necessary to form the organic insulating film PIQ2. However, it is preferable to form the organic insulating film PIQ2 when it is desired to ensure higher reliability.

Subsequently, as shown in FIG. 2, the opening OP2 is selectively formed in the organic insulating film PIQ2. A part of the redistribution layer RW constitutes the second pad electrode PD2 which is the region to be connected to the external connection terminal TR, and the opening OP2 is formed so as to expose the second pad electrode PD2. Thereafter, the external connection terminal TR is formed on the second pad electrode PD2. In the present embodiment, the case where a bump electrode is used as the external connection terminal TR is shown by way of example. In the manner described above, the semiconductor device according to the present embodiment is formed.

Second Embodiment

Figure 14:
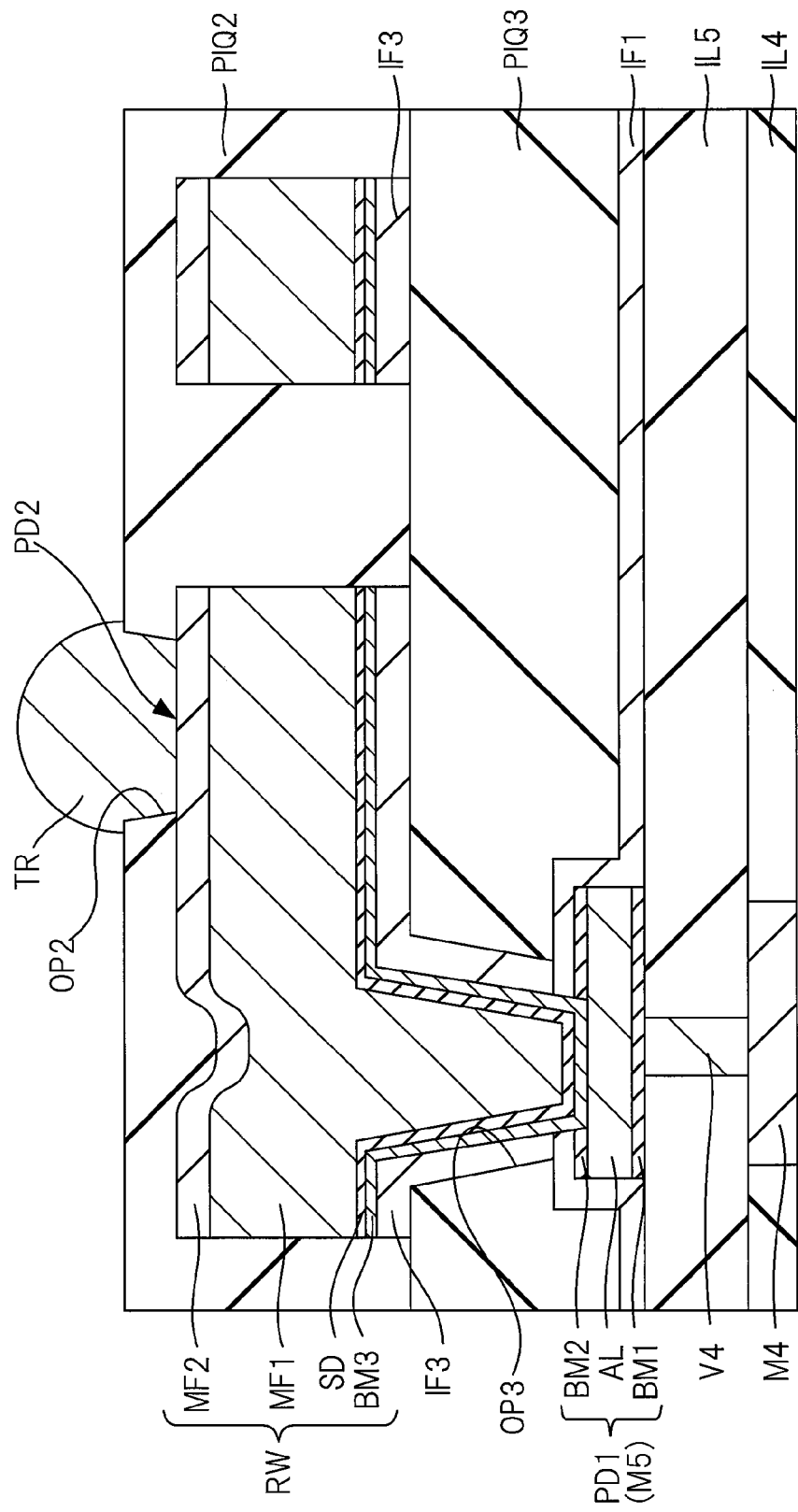
FIG. 14 is a cross-sectional view showing a semiconductor device according to a second embodiment.

FIG. 14 is a cross-sectional view showing a principal part of a semiconductor device according to a second embodiment taken along a line A-A of FIG. 1. In the description of the second embodiment, an organic insulating film PIQ3 and an insulating film IF3 are regarded as corresponding to the organic insulating film PIQ1 and the insulating film IF2 of the first embodiment.

In the first embodiment described above, on the upper surface of the organic insulating film PIQ1, the insulating film IF2 made of an inorganic material is formed between the barrier metal film BM3 and the organic insulating film PIQ1.

In the second embodiment, as shown in FIG. 14, the insulating film IF3 is formed not only on the upper surface of the organic insulating film PIQ3 but also on the side surface of the organic insulating film PIQ3 in an opening OP3. The insulating film IF3 is an insulating film of an inorganic material, and is made of, for example, silicon nitride or silicon oxide.

Accordingly, it is possible to prevent the barrier metal film BM3 and the organic insulating film PIQ3 from reacting with each other to form the reaction product RC in the opening OP3. Also, since the insulating film IF3 is made of an inorganic material, metal carbide such as titanium carbide is not formed even when the barrier metal film BM3 comes in contact with the insulating film IF3. Therefore, it is possible to prevent a part of the barrier metal film BM3 from being a high resistance conductor such as titanium carbide to increase the resistance of the barrier metal film BM3. As a result, it is possible to further reduce the resistance of the barrier metal film BM3 in the opening OP3 as compared with the first embodiment. Namely, the semiconductor device according to the second embodiment not only has the effect similar to that of the first embodiment but also can further reduce the resistance of the entire redistribution layer RW.

Also, since the insulating film IF3 of an inorganic material having a hardness higher than that of the organic insulating film PIQ3 is formed on the side surface of the organic insulating film PIQ3 in the opening OP3, the mechanical strength of the redistribution layer RW can be further increased as compared with the first embodiment.

Figure 15:
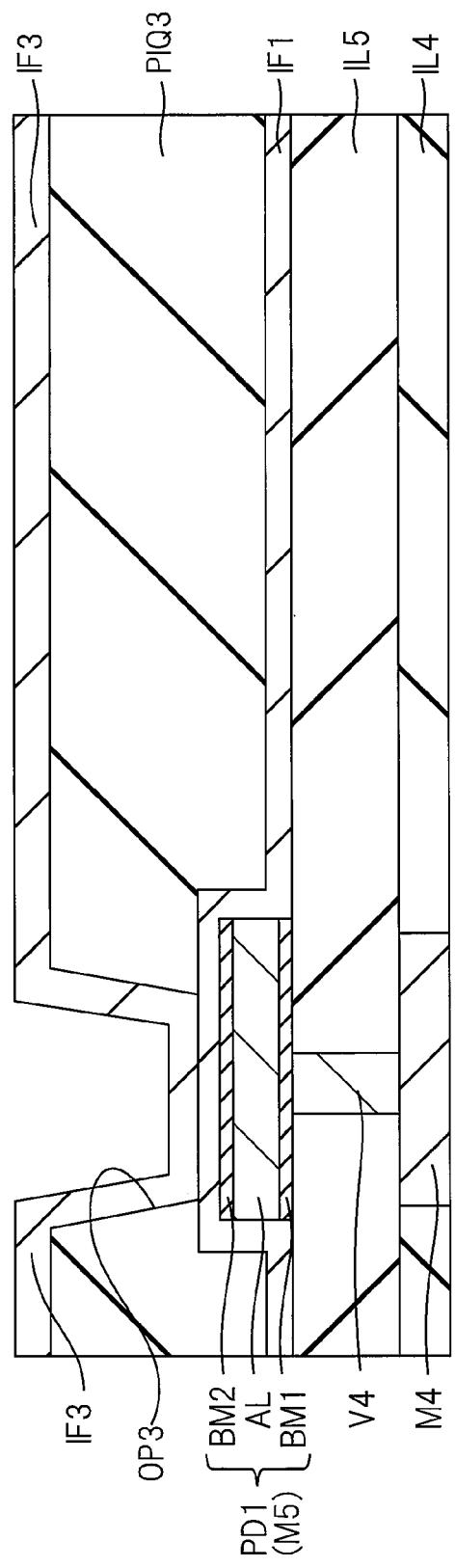
FIG. 15 is a cross sectional view showing a manufacturing process of the semiconductor device according to the second embodiment.
Figure 16:
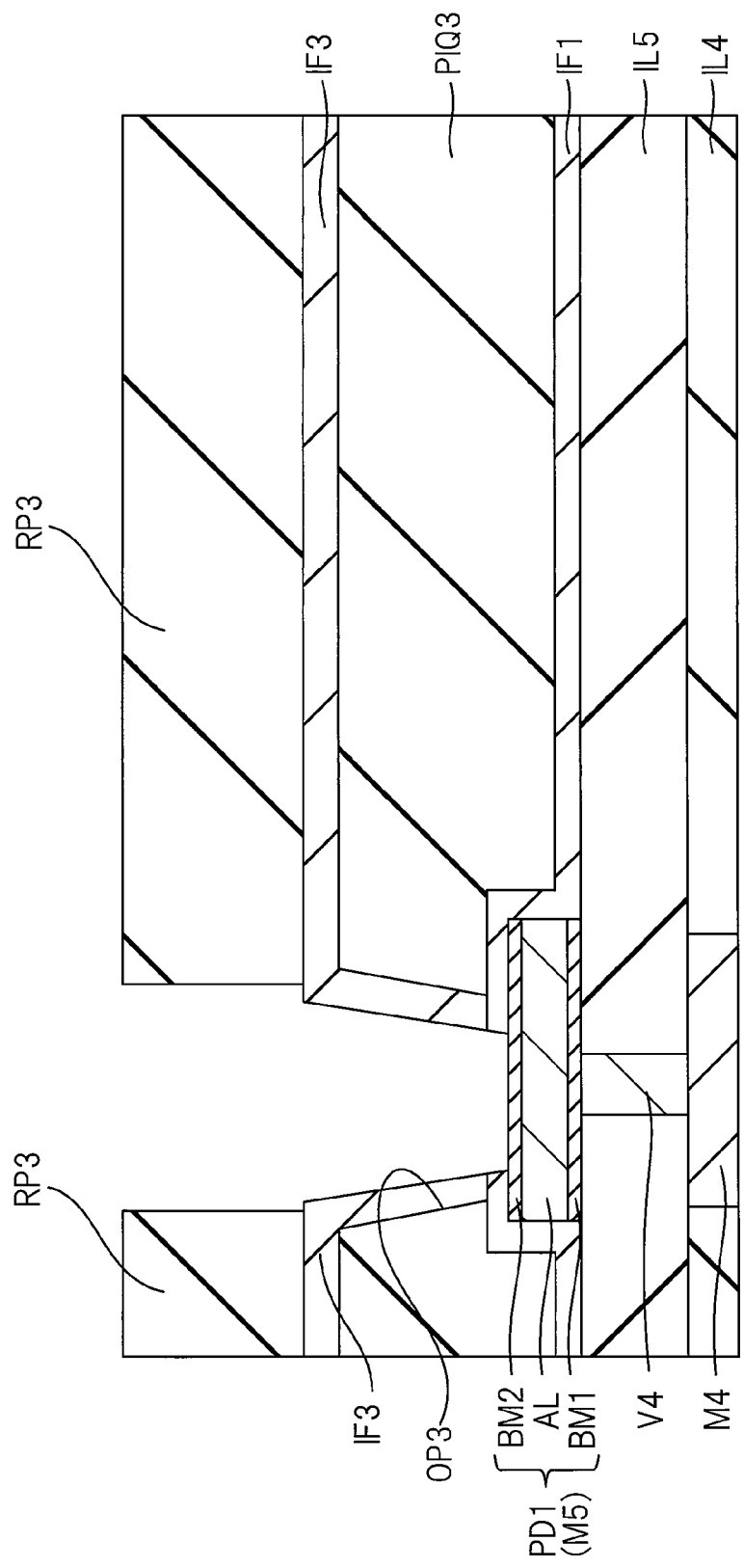
FIG. 16 is a cross-sectional view showing the manufacturing process of the semiconductor device continued from FIG. 15.
Figure 17:
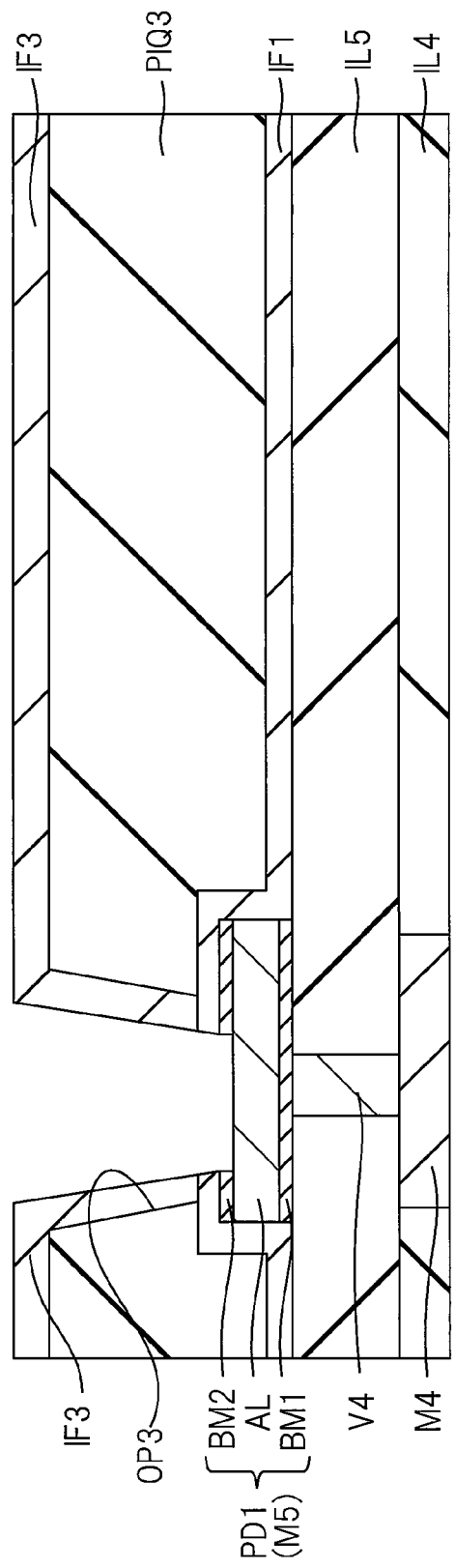
FIG. 17 is a cross-sectional view showing the manufacturing process of the semiconductor device continued from FIG. 16.

FIG. 15 to FIG. 17 show a part of a manufacturing process of the semiconductor device according to the second embodiment, and show the process subsequent to FIG. 4 of the first embodiment.

As shown in FIG. 15, the organic insulating film PIQ3 is formed over the insulating film IF1. The organic insulating film PIQ3 is an organic resin film formed by the coating method, is a film to which photosensitizing agent is added, and is made of, for example, photosensitive polyimide. Next, a part of the organic insulating film PIQ3 is patterned by exposing it to light, thereby forming the opening OP3 in the organic insulating film PIQ3. Thereafter, heat treatment is performed to cure the organic insulating film PIQ3.

Subsequently, the insulating film IF3 is formed over the organic insulating film PIQ3 and in the opening OP3. The insulating film IF3 is an insulating film of an inorganic material formed by the low-temperature plasma CVD method, and is made of, for example, silicon nitride or silicon oxide. In addition, the insulating film IF3 is a material having a hardness higher than any of the organic insulating film PIQ3 and the organic insulating film PIQ2. Further, the condition of the plasma CVD method is the same as that for the insulating film IF2 of the first embodiment. Note that the thickness of the insulating film IF3 is about 50 to 300 nm.

Subsequently, as shown in FIG. 16, a resist pattern RP3 having an opening above the first pad electrode PD1 is formed over the insulating film IF3. Next, the insulating film IF3 and the insulating film IF1 located in the region exposed from the resist pattern RP3 are sequentially removed by the dry etching or the wet etching. As a result, the opening OP3 reaches the first pad electrode PD1.

In the first embodiment, it is preferable that the insulating film IF2 and the insulating film IF1 are made of different materials because the insulating film IF1 is removed with using the insulating film IF2 as a mask. On the other hand, in the second embodiment, the insulating film IF3 and the insulating film IF1 may be made of the same material or different materials. However, in the case of the same material, it is not necessary to change the type of the etching gas used in the dry etching or the type of the solution used in the wet etching. Namely, since the etching process can be consecutively performed in the same apparatus under the same condition, it is possible to simplify the manufacturing process.

In addition, the barrier metal film BM2 at the bottom of the opening OP3 may be removed as in the first embodiment. In this case, it is possible to reduce the resistance between the first pad electrode PD1 and the redistribution layer RW as in the first embodiment. In the following description, the case where the barrier metal film BM2 at the bottom of the opening OP3 is removed is illustrated.

Subsequently, as shown in FIG. 17, the resist pattern RP3 is removed by the ashing process or the like. Since the following process is the same as the process subsequent to FIG. 8 of the first embodiment, the description thereof is omitted.

In the foregoing, the invention made by the inventor of the present invention has been concretely described based on the embodiments. However, the present invention is not limited to the foregoing embodiments and various modifications and alterations can be made within the scope of the present invention.

For example, although each of the wirings M1 to M4 is described as having the damascene structure containing copper as a main component, the same effect can be obtained even in the case of the wiring structure formed by patterning conductive films containing aluminum as a main component.

What is claimed is:

1. A semiconductor device, comprising:
   a multilayer wiring layer formed over a semiconductor substrate;
   a first pad electrode formed in an uppermost wiring layer of the multilayer wiring layer;
   a first insulating film formed to cover at least part of the first pad electrode and made of an inorganic material;
   a first organic insulating film formed over the first insulating film;
   a first opening provided in the first organic insulating film and the first insulating film and formed to reach the first pad electrode;
   a first barrier metal film formed over the first organic insulating film and connected to the first pad electrode through the first opening; and
   a first conductive film formed over the first barrier metal film,
   wherein a second insulating film made of an inorganic material is formed on an upper surface of the first organic insulating film between the first barrier metal film and the first organic insulating film,
   wherein the first pad electrode includes a second conductive film and a second barrier metal film for ed on the second conductive film, and
   the second barrier metal film is removed at a bottom of the first opening, and the first barrier metal film is in direct contact with the second conductive film.

2. The semiconductor device according to claim 1,
   wherein the second insulating film is formed on a side surface of the first organic insulating film in the first opening between the first barrier metal film and the first organic insulating film.

3. The semiconductor device according to claim 1,
   wherein a plurality of redistribution layers having the first barrier metal film and the first conductive film are formed, and
   no reaction product of the first organic insulating film and the first barrier metal film is formed on the upper surface of the first organic insulating film between the redistribution layers adjacent to each other.

4. The semiconductor device according to claim 3,
   wherein a second organic insulating film is formed over the first organic insulating film so as to cover the plurality of redistribution layers, and
   the second insulating film is removed in a region between the adjacent redistribution layers, and the first organic insulating film and the second organic insulating film are in direct contact with each other.

5. The semiconductor device according to claim 1,
   wherein the first organic insulating film is made of polyimide,
   the first barrier metal film is made of a material containing titanium, tantalum, or chromium,
   the first conductive film is made of a material containing copper as a main component, and
   the second insulating film is made of a material containing silicon oxide or silicon nitride.

6. A manufacturing method of a semiconductor device, comprising:
   (a) preparing a semiconductor substrate, a multilayer wiring layer formed over the semiconductor substrate, a first pad electrode formed in an uppermost wiring layer of the multilayer wiring layer, and a first insulating film formed to cover the first pad electrode and made of an inorganic material;
   (b) forming a first organic insulating film over the first insulating film;
   (c) forming a second insulating film made of an inorganic material over the first organic insulating film;
   (d) forming a first resist pattern over the second insulating film;
   (e) performing an etching process by using the first resist pattern as a mask, thereby selectively removing the second insulating film located over the first pad electrode;
   (f) after (e), removing the first resist pattern and the first organic insulating film located over the first pad electrode;
   (g) after (f), performing an etching process in a state where the second insulating film remains, thereby selectively removing the first insulating film located over the first pad electrode and forming a first opening reaching the first pad electrode;
   (h) forming a first barrier metal film connected to the first pad electrode, over the second insulating film and in the first opening;
   (i) forming a second resist pattern over the first barrier metal film; and
   (j) forming a first conductive film by a plating method over the first barrier metal film in a region exposed from the second resist pattern,
   wherein the first pad electrode includes a second conductive film and a second barrier metal film formed on the second conductive film,
   between (g) and (h), the second barrier metal film at a bottom of the first opening is removed, and
   in (h), the first barrier metal film is in direct contact with the second conductive film.

7. The manufacturing method of a semiconductor device according to claim 6,
   wherein the second insulating film is made of a material different from that of the first insulating film.

8. The manufacturing method of a semiconductor device according to claim 6, further comprising:
   (k) after (j), removing the second resist pattern; and
   (l) after (k), removing the first barrier metal film in a region exposed from the first conductive film.

9. The manufacturing method of a semiconductor device according to claim 8, further comprising:
   (m) after (l), removing the second insulating film in the region exposed from the first conductive film; and
   (n) after (m), forming a second organic insulating film over the first organic insulating film so as to cover the first conductive film,
   wherein the first organic insulating film and the second organic insulating film are in direct contact with each other in the region exposed from the first conductive film.

10. The manufacturing method of a semiconductor device according to claim 6, wherein the first organic insulating film is made of polyimide, the first barrier metal film is made of a material containing titanium, tantalum, or chromium, the first conductive film is made of a material containing copper as a main component, and the second insulating film is made of a material containing silicon oxide or silicon nitride.

11. The manufacturing method of a semiconductor device according to claim 6, wherein the second insulating film is formed by a plasma CVD method at 350° C. or lower.

12. A manufacturing method of a semiconductor device, comprising the stops f:

(a) preparing a semiconductor substrate, a multilayer wiring layer famed over the semiconductor substrate, a first pad electrode formed in an uppermost wiring layer of the multilayer wiring layer, and a first insulating film formed to cover the first pad electrode and made of an inorganic material;

(b) forming a first organic insulating film over the first insulating film;

(c) forming a first opening reaching the first pad electrode in the first organic insulating film;

(d) forming a second insulating film made of an inorganic material over the first organic insulating film and in the first opening;

(e) forming a first resist pattern over the second insulating film;

(f) performing an etching process by using the first resist pattern as a mask, thereby selectively removing the second insulating film located over the first pad electrode;

(g) after (f), selectively removing the first insulating film located over the first pad electrode;

(h) after (g), forming a first barrier metal film connected to the first pad electrode, over the second insulating film and in the first opening;

(i) forming a second resist pattern over the first barrier metal film; and (j) forming a first conductive film by a plating method over the first barrier metal film in a region exposed from the second resist pattern.

13. The manufacturing method of a semiconductor device according to claim 12, wherein the second insulating film is made of the same material as that of the first insulating film, and the etching process is consecutively performed under the same condition in (f) and (g).

14. The manufacturing method of a semiconductor device according to claim 12, wherein the first pad electrode includes a second conductive film and a second barrier metal film formed on the second conductive film, between (g) and (h), the second barrier metal film at a bottom of the first opening is removed, and in (h), the first barrier metal film is in direct contact with the second conductive film.

15. The manufacturing method of a semiconductor device according to claim 12, further comprising:

(k) after (j), removing the second resist pattern; and (l) after (k), removing the first barrier metal film in a region exposed from the first conductive film.

16. The manufacturing method of a semiconductor device according to claim 15, further comprising:

(m) after (l), removing the first insulating film in the region exposed from the first conductive film; and (n) after (m), forming a second organic insulating film over the first organic insulating film so as to cover the first conductive film, wherein the first organic insulating film and the second organic insulating film are in direct contact with each other in the region exposed from the first conductive film.

17. The manufacturing method of a semiconductor device according to claim 12, wherein the first organic insulating film is made of polyimide, the first barrier metal film is made of a material containing titanium, tantalum, or chromium, the first conductive film is made of a material containing copper as a main component, and the second insulating film is made of a material containing silicon oxide or silicon nitride.

18. The manufacturing method of a semiconductor device according to claim 12, wherein the second insulating film is formed by a plasma CVD method at 350° C. or lower.

* * * * *